United States Patent
Shiomoto et al.

(10) Patent No.: US 6,456,635 B1
(45) Date of Patent: Sep. 24, 2002

(54) SEMICONDUCTOR LASER DEVICE

(75) Inventors: Takehiro Shiomoto, Kashihara; Ikuo Kohashi, Gojo, both of (JP)

(73) Assignee: Sharp Kabushiki Kaishiki, Osaka (JP)

( * ) Notice: Subject to any disclaimer, the term of this patent is extended or adjusted under 35 U.S.C. 154(b) by 0 days.

(21) Appl. No.: 09/508,630

(22) PCT Filed: Jul. 13, 1999

(86) PCT No.: PCT/JP99/03765
  § 371 (c)(1),
  (2), (4) Date: Mar. 14, 2000

(87) PCT Pub. No.: WO00/04614
  PCT Pub. Date: Jan. 27, 2000

(30) Foreign Application Priority Data

Jul. 14, 1998 (JP) .......................................... 10-198457

(51) Int. Cl.⁷ .............................................. H01S 5/024
(52) U.S. Cl. ...................................................... 372/36
(58) Field of Search ........................................... 372/36

(56) References Cited

U.S. PATENT DOCUMENTS

| | | | | |
|---|---|---|---|---|
| 4,517,667 A | 5/1985 | Sprague | | 369/112 |
| 4,860,276 A | 8/1989 | Ukita et al. | | 369/119 |
| 5,157,682 A | 10/1992 | Shimada | | 372/50 |
| 5,608,749 A | * 3/1997 | Kizuki | | 372/36 |
| 5,619,488 A | 4/1997 | Ota et al. | | 369/112 |
| 5,933,402 A | 8/1999 | Lee et al. | | 369/121 |

FOREIGN PATENT DOCUMENTS

| | | |
|---|---|---|
| EP | 0 810 589 A2 | 12/1997 |
| EP | 0838813 A3 | 1/1998 |
| EP | 0838813 A2 | 4/1998 |
| EP | 0 936 604 | 8/1999 |
| JP | 62-152474 | 9/1987 |
| JP | 63298724 | 12/1988 |
| JP | 64-60829 | 3/1989 |
| JP | 02159083 | 6/1990 |
| JP | 4-32288 | 2/1992 |
| JP | 04032288 | 2/1992 |
| JP | 4-154182 | 5/1992 |
| JP | 09128782 | 5/1997 |
| JP | 9-320098 | 12/1997 |
| JP | 10031841 | 2/1998 |
| JP | 10-69670 | 3/1998 |
| JP | 10-312577 | 11/1998 |
| JP | 10-335746 | 12/1998 |
| JP | 11-4047 | 1/1999 |
| JP | 11-112108 | 4/1999 |
| WO | WO 98/19303 | 5/1998 |

OTHER PUBLICATIONS

Akira Takamori, Semiconductor Laser Diode Provides Two–Beam Output for Optical Disks, 2209, JEE Journal of Electronic Engineering 31 (1994) Apr., No. 328, Tokyo, JP.
European Search Report.
EPO Communication Pursuant to Article 96 (2) EPC.
EPO Result of Consultation.

* cited by examiner

Primary Examiner—James Davie
(74) Attorney, Agent, or Firm—David G. Conlin; John B. Alexander; Edwards & Angell, LLP

(57) ABSTRACT

A semiconductor laser device (100) comprises a first semiconductor laser element (31) and a second semiconductor laser element (32) of different wavelengths, which are mounted on a heat sink block (2) directly or through a sub-mount provided on the heat sink block. The optical axes (A, B) of the semiconductor laser elements are substantially parallel to each other. The first and second semiconductor laser elements (31, 32) are mounted on the heat sink block (2) in such a manner that a relationship of $0 \leq L \leq d1 + d2 \leq 160 \, \mu m$ is satisfied, where d1 is a distance between the optical axis (A) of the first semiconductor laser element (31) and the center axis (O) of a condenser lens (71) arranged in front of the semiconductor laser device (i.e., faced to the emission surfaces of the semiconductor laser elements), d2 is a distance between the optical axis (B) of the second semiconductor laser element (32) and the center axis of the condenser lens, and L is a distance between the optical axes of the first and second semiconductor laser elements.

10 Claims, 6 Drawing Sheets

SEMICONDUCTOR LASER DEVICE

TECHNICAL FIELD

The present invention relates to a semiconductor laser device suitable for constructing an optical pickup reading information from and writing information to different types of optical discs.

BACKGROUND ART

Optical discs are used not only for video/audio recording but also as computer external storage media because they have a large recording capacity and a random access characteristic that the access time is not varied irrespective of an information-recording position. However, different types of optical discs are used according to purpose. Thus, characteristics demanded of the optical pickups differ depending on the type of optical discs for which the optical pickups are used.

In optical pickups reading compact discs (CD) that are used to record audio information and CD-ROM media formed by formatting the CD as computer external storage media, an optical spot having a large diameter can be used. Thus, an infrared semiconductor laser device emitting a light beam having a wavelength in the vicinity of 780 nm is used as a light source, and a condenser lens having a numerical aperture (NA) of about 0.45 is used.

In optical pickups which read information from a digital versatile disc (DVD) having a large memory capacity and used to record video information or the like, it is necessary to make the optical spot smaller. Thus, as the light source of the DVD optical pickup, a red semiconductor laser device emitting a light beam having a wavelength of 630–680 nm is used, and a condenser lens having a NA of about 0.6 is used. The optical pickup for DVD can also read information from the CD and the CD-ROM by adjusting the NA of the condenser lens by, for example, using a diaphragm.

Optical discs called "CD-R" which have an information recording format common to the CD and to which information can be written only once are spreading widely. This is because the optical discs CD-R are not only readable by an ordinary optical pickup for the CD, but also inexpensive. As the material of the CD-R, in consideration of compatibility with the CD, a recording film made of an organic material is used which is designed such that read and write of information can be preferably accomplished for light having a wavelength in the neighborhood of 780 nm. Thus, the CD-R disc is not readable unless an optical pickup using an infrared laser as its light source is employed.

In order for one optical pickup to read information of different types of optical discs such as CD, CD-ROM, CD-R, and DVD, a red semiconductor laser and an infrared semiconductor laser are required as its light source.

Changing the optical pickup for each type of the optical discs causes inconvenience and the device size will become large. Thus, there is a growing demand for the development of an optical pickup that is capable of reading information from and writing information to different types of optical discs, has a size not different from that of the conventional optical pickup for CD, and can be produced with a technique equivalent to that employed to manufacture the conventional optical pickup for CD.

To allow the optical pickup to read information from and write information to different types of optical discs, two kinds of laser light sources, namely, the red semiconductor laser and the infrared semiconductor laser are required, as described above. The sizes of the laser light sources define the size of the optical pickup. That is, a conventional semiconductor laser device has an internal construction shown, for example, in FIG. 6.

In FIG. 6, a semiconductor laser element 3 is fixed to a heat sink block 2 formed integrally with a mount 1 made of a metal disc, using an electrically conductive adhesive material or a soldering material (not shown). The semiconductor laser element is typically about 200 $\mu$m in width, about 250 $\mu$m in length, and about 100 $\mu$m in thickness. Because flat planes are formed on the heat sink block 2 by molding, the length of one side of the heat sink block 2 is set to 2 mm or more.

A monitoring photodiode (PD) 6 is provided in a recess 1a of the mount 1 for monitoring the intensity of light emitted from a rear end face of the semiconductor laser element 3. The monitoring PD 6 is fixed by an electrically conductive adhesive material or a metallic soldering material (not shown) applied in advance to a bottom surface of the recess 1a and to a lower surface of the monitoring PD 6.

To accommodate the semiconductor laser element 3, the heat sink block 2, and the monitoring PD 6 in one package, after they are covered with a cap (not shown) having a laser beam-emitting window, the cap is welded to the mount 1. The welding of the cap is performed in an atmosphere of an inert gas such as nitrogen, argon or the like or dry air so that moisture does not remain in the package. The cap is welded to the mount 1 with no gap therebetween to keep the inside of the package airtight and prevent moisture from penetrating into the package from outside so that semiconductor devices such as the semiconductor laser element 3 and the monitoring PD 6 are prevented from deteriorating over a long period of time.

To electrically connect the semiconductor devices with the outside, there are provided a plurality of lead pins penetrating through the mount 1 in a manner insulated from the mount 1. More specifically, an upper electrode 3a of the semiconductor laser element 3 and a flat portion 51a of a lead pin 51 having a diameter of about 0.2 mm are electrically connected to each other with a gold wire 501. A surface electrode 6a of the monitoring PD 6 and a front end of a lead pin 52 are connected to each other with a gold wire 502. For insulation, the mount 1 and the lead pins 51, 52 are spaced by a gap of 0.1 mm or more and fixed to each other with an insulating material.

The inner diameter of the cap is such that the cap does not contact the lead pins. To keep the inside of the cap airtight, a part of the cap that contacts the mount 1 has a flat surface having a width of about 0.5 mm. Therefore, it is necessary that the mount 1 should have a diameter of more than 3.8 mm.

An optical axis C of the semiconductor laser element 3 passes through an emission point 301 and is perpendicular to a front end surface of the semiconductor laser element 3. If the distance between the optical axis of the semiconductor laser that is used as a light source and the axis of a condenser lens is sufficiently short, preferably less than 80 $\mu$m, it is possible to read information from an optical disc. That is, as the distance between the optical axis of the semiconductor laser element and the axis of the condenser lens becomes longer, spherical aberration increases quadrically. As a result, the spot diameter of the condensed light becomes large and thus information cannot be read. For example, in an optical disc system, a tolerable spherical aberration limit is Marechal limit (0.07$\lambda$, where $\lambda$ is a wavelength of a laser beam). In the case of the condenser lens used in an ordinary optical pickup, if the distance between the axis of the condenser lens and the optical axis of the semiconductor laser element is about 80 μm, then the spherical aberration exceeds Marechal limit.

If the infrared semiconductor laser element and the red semiconductor laser element are arranged simply side by side to be used as the light sources, the distance L between the optical axis of an infrared laser beam and that of a red laser beam will be more than 3.8 mm because the diameter of the mount 1 is more than 3.8 mm or more, as described above. In this case, the distance between the center axis of the condenser lens and the optical axis of each laser beam exceeds 80 μm without failure. Accordingly, without shifting the condenser lens, it is impossible to read information from and write information to different types of optical discs.

To solve this problem, an optical pickup as shown in FIG. 7 is described in Nikkei Electronics No. 687, page 138, published on Apr. 21, 1997. This optical pickup uses red and infrared semiconductor laser devices having the same construction as that shown in FIG. 6 as light sources 101 and 102. In the optical pickup, a prism 76 is used to make the distance between the optical axes of the laser beams sufficiently small so as to read information from and write information to different optical discs 81 and 82 without moving a condenser lens 71.

The operation of the optical pickup of FIG. 7 is described below in detail. In the optical pickup, to utilize light with increased efficiency, a polarizing beam splitter is used as the prism 76. The polarization direction of the infrared laser beam and that of the red laser beam are orthogonal to each other. The polarizing beam splitter completely transmits or reflects laser beams emitted by the semiconductor laser devices. These two light beams pass through a ¼ wavelength plate 72, whereby they are converted into circularly polarized light beams such that they rotate in opposite directions. The circularly polarized light beams are then reflected by the optical disc 81 or 82 and enter the ¼ wavelength plate 72 again, whereby they are converted into linearly polarized light beams orthogonal to each other. Then, the polarization beam splitter 76 reflects the infrared light completely and transmits the red light completely. Then, the infrared light and the red light return to the respective semiconductor laser devices and detected.

A collimator lens 75 has a function of converting light beams emitted by the semiconductor laser devices 101 and 102 into parallel light beams. Omission of the collimator lens 75 is no problem theoretically. Practically, however, provision of the collimator lens 75 can stabilize the characteristic of the optical pickup.

A polarizing hologram 73 enlarges the diameter of the red laser beam emitted by the semiconductor laser device 102 to thereby allow the effective NA of the condenser lens 71 to be large so that an optical spot of the condensed light beam has a size suitable for reading information of the DVD. Because the polarizing hologram 73 does not have any influence on the infrared light beam, which is orthogonal to the red light beam in the polarization direction, the effective NA of the condenser lens 71 is small for the infrared light beam. Therefore, the spot diameter of the condensed infrared light beam is appropriate to read information from a CD.

A hologram element 77 mounted on the infrared semiconductor laser device 101 has a function of generating track-controlling three light beams and converting the direction of a signal beam which has been reflected by the optical disc 81 so that the signal beam is incident on a photodiode (not shown) for the signal.

The optical pickup is assembled in the following procedure. Optical elements, namely, the prism 76, the collimator lens 75, a rise mirror 74, the polarizing hologram 73, and the ¼ wavelength plate 72 are positioned and mounted at predetermined positions with respect to the center axis O of the condenser lens 71. The red semiconductor laser device 102 is mounted in such a manner that its optical axis B is substantially coincident with the center axis O of the condenser lens 71. Then, the path of the optical axis A of the infrared semiconductor laser device 101 is changed by 90° by the prism 76 and then adjusted such that the optical axis A is parallel to the center axis O of the condenser lens 71. Thereafter, a parallel movement of the infrared semiconductor laser device 101 is performed to make the optical axis A and the axis O of the condenser lens 71 substantially coincident with each other.

If the condenser lens 71 is regarded as a reference, position adjustment of the optical component parts such as the prism 76, the red semiconductor laser device 102, and the infrared semiconductor laser device 101 is required. If deviations of these optical elements from an ideal position are taken as s1, s2, and s3, respectively, then a mechanical mounting accuracy S is expressed by an equation (1) below:

$$S=\sqrt{s1^2+s2^2+s3^2} \qquad (1)$$

With the increase of the number of component parts, the mounting accuracy S has a large value, which makes it difficult to assemble them. As is obvious from the above, it is much more difficult to produce an optical pickup capable of reading information from and writing information to different types of optical discs by using the conventional semiconductor laser elements shown in FIG. 6 as its light sources than to produce the conventional optical pickup for CDs that needs no prism.

DISCLOSURE OF THE INVENTION

The present invention has been made in view of the problem, and it is an object of the present invention to provide a semiconductor laser device that enables realization of an optical pickup capable of reading information from and writing information to optical discs of different types, such as CD, CD-R, and DVD, without increasing the number of component parts and with an assembling technique similar to that employed for the conventional optical pickup.

In order to accomplish the above object, the present invention provides a semiconductor laser device for use in an optical pickup reading and writing information by selecting one of light beams emitted by two semiconductor laser elements having different emission wavelengths and then condensing the selected light beam on one of different optical discs through an optical system including a condenser lens, comprising:

a heat sink block; and a first semiconductor laser element and a second semiconductor laser element having different emission wavelengths and mounted on the heat sink such that optical axes of the first and second semiconductor laser elements are substantially parallel to each other, wherein the first and second semiconductor laser elements are mounted on the heat sink block in such a manner that the following relationship is satisfied:

$$0 \leq L \leq d1+d2 \leq 160 \ \mu m,$$

where d1 is a distance between the optical axis of the first semiconductor laser element and a center axis of the condenser lens, d2 is a distance between the optical axis of the second semiconductor laser element and the center axis of the condenser lens, and L is a distance between the optical axes of the first and second semiconductor laser elements.

The reason the distance L between the optical axes of the first and second semiconductor laser elements is preferably 160 μm or less is as follows:

It is ideal that the axis of the condenser lens is coincident with the optical axis of the semiconductor laser element. That is, it is ideal that the emission point of the semiconductor laser element is present on the axis of the condenser lens. If the axis of the condenser lens is not coincident with the optical axis of the semiconductor laser element, spherical aberration increases quadrically, as described above. As a result, the diameter of an optical spot of condensed light beam becomes large and thus information cannot be read. For example, in an optical disc system, Marechal limit ($0.07\lambda$, where $\lambda$ is a wavelength of a laser beam) is a tolerable spherical aberration limit. In a condenser lens for use in an ordinary optical pickup, if the distance between the center axis of the condenser lens and the optical axis of the semiconductor laser element is more than 80 μm, the spherical aberration exceeds Marechal limit. If distances between the axis of the condenser lens and each of optical axes of different two semiconductor laser elements are taken as d1 and d2, respectively, then, neither d1 nor d2 should exceed 80 μm. This condition can be satisfied if the distance L between the optical axes of these two semiconductor laser elements is 160 μm and if the axis of the condenser lens falls on a line connecting the emission points of the two semiconductor laser elements. If L is less than 160 μm, the above condition can be satisfied even though the axis of the condenser lens runs outside the line connecting the emission points of the two semiconductor laser elements. On the other hand, if L is more than 160 μm, at least one of d1 and d2 exceeds 80 μm, irrespective of the position of the axis of the condenser lens. From this, 160 μm is critical as a value of L.

The first semiconductor laser element is for example an infrared laser element and the second semiconductor laser element is for example a red laser element. Of course, it is possible to use semiconductor laser elements of other wavelengths such as a blue laser element.

In the semiconductor laser device having the above construction, the semiconductor laser elements are mounted on the same heat sink block and a relationship of $0 \leq L \leq d1+d2 < 160$ μm holds between the condenser lens and each of the first and second semiconductor laser elements. Therefore, each of d1 and d2 can be set to 80 μm or less. Accordingly, using this semiconductor laser device, it is possible to produce an optical pickup capable of reading information from and writing information to different types of optical discs without moving or shifting the condenser lens nor increasing the number of component parts.

More specifically, an optical pickup incorporating the semiconductor laser device having the above construction can generate light beams having a wavelength 650 nm and 780 nm along optical paths parallel to each other and spaced at an interval of 160 μm or less. Accordingly, the optical pickup can read information from discs of DVD and CD media including CD-R media currently on the market.

In one embodiment, one of the first and second semiconductor laser elements has been shifted in a direction of its optical axis to rearward of the other semiconductor laser element such that emission end surfaces of the first and second semiconductor laser elements are contained in different planes, and the one semiconductor laser element has been shifted in a direction perpendicular to its optical axis toward the other semiconductor laser element to an extent that the optical axis of the one semiconductor laser element does not pass the other semiconductor laser element.

With this arrangement, it is possible to set the distance L between the two optical axes to 160 μm or less even if a semiconductor laser element having its emission point at its center and having a normal width (200–300 μm) is used as the first/second semiconductor laser element.

In this embodiment, in order to prevent the light emitted from the one semiconductor laser element, namely, the semiconductor laser element located at the rear side in the direction of the optical axis, from being reflected by the heat sink block positioned forward of the semiconductor laser element, it is permissible to cut out a part of the heat sink block located at the front side in the direction in which the outgoing light of the semiconductor laser element advances. Alternatively, the one semiconductor laser element may be mounted on the heat sink block through a sub-mount.

The first and second semiconductor laser elements and the heat sink block are accommodated in a same package.

For the first and second semiconductor laser elements, semiconductor laser elements having emission points at different positions may be used. In this case, the method of manufacturing the first and second semiconductor laser elements is not limited to a specific one, and any emission wavelength can be obtained as desired.

The first and second semiconductor laser elements may be mounted directly on the heat sink block. Alternatively, at least one of the first and second semiconductor laser elements may be mounted on the heat sink block through a sub-mount.

When the sub-mount is used, and if the emission points of the two semiconductor laser elements are at levels different from each other, it is possible to locate these emission points at the same level by adjusting the height of the sub-mount. Further, the semiconductor laser element can be inspected before it is assembled in the semiconductor laser device. Further, it is possible to avoid a possible problem that a soldering material that is used to fix the semiconductor laser element to the heat sink block rises up to the emission point and thus blocks the path of the laser beam partly or the soldering material climbs the semiconductor laser element and thus causes a short circuit.

In one embodiment, the emission points of the first and the second semiconductor laser elements are located between a center axis of the first semiconductor laser element and a center axis of the second semiconductor laser element.

In this case, the distance L between the optical axes can be set to 160 μm or less, irrespective of the widths of the semiconductor laser elements. Therefore, even if a semiconductor laser element having a normal width (200–300 μm) is used as the first/second semiconductor laser element, the distance L between the optical axes can be set to 160 μm or less.

The semiconductor laser device may further comprise a third semiconductor laser element having an emission wavelength different from the wavelengths of the first and second semiconductor laser elements and mounted on the heat sink block such that an optical axis of the third semiconductor laser element is substantially parallel to each of the optical axes of the first and second semiconductor laser elements. In this case, the three semiconductor laser elements are mounted on the heat sink block in such a manner that the following relationships are satisfied:

$$0 \leq L1 \leq d1+d3 \leq 160 \text{ μm},$$

and $$0 \leq L2 \leq d2+d3 \leq 160 \text{ μm},$$

where d3 is a distance between the optical axis of the third semiconductor laser element and the axis of the condenser lens, L1 is a distance between the optical axes of the first and third semiconductor laser elements, and L2 is a distance between the optical axes of the second and third semiconductor laser elements.

Because the three semiconductor laser elements are mounted on the common heat sink block, relative positions between each two semiconductor laser elements can be set with accuracy.

BEST MODE FOR CARRYING OUT THE INVENTION

Figure 5A:
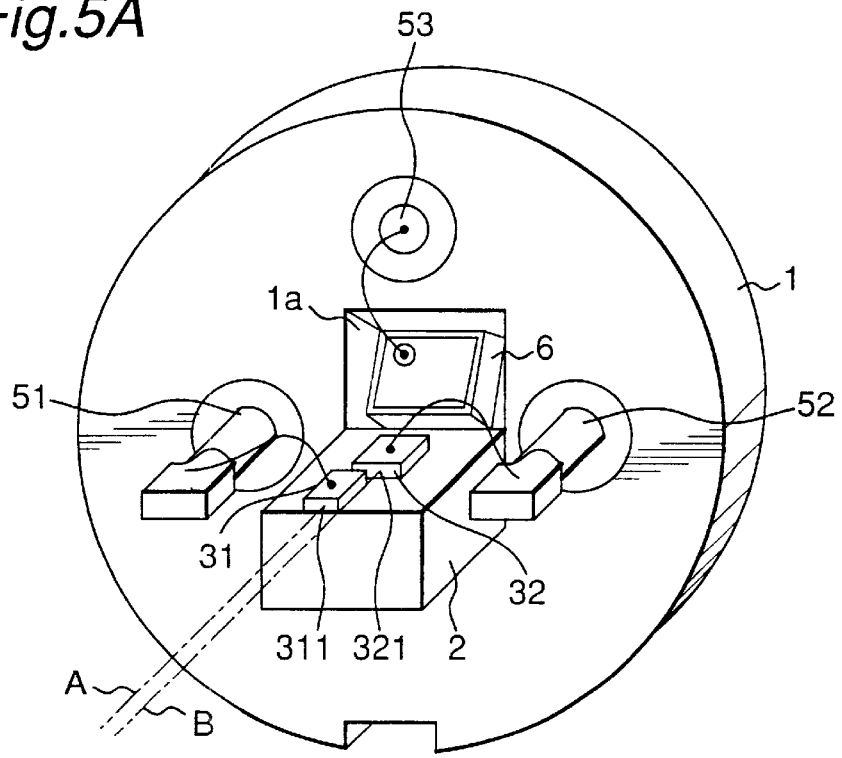
FIG. 5A is a perspective view showing the innards of the semiconductor laser device of a fourth embodiment of the present invention in which an ordinary heat sink block is used.
Figure 5B:
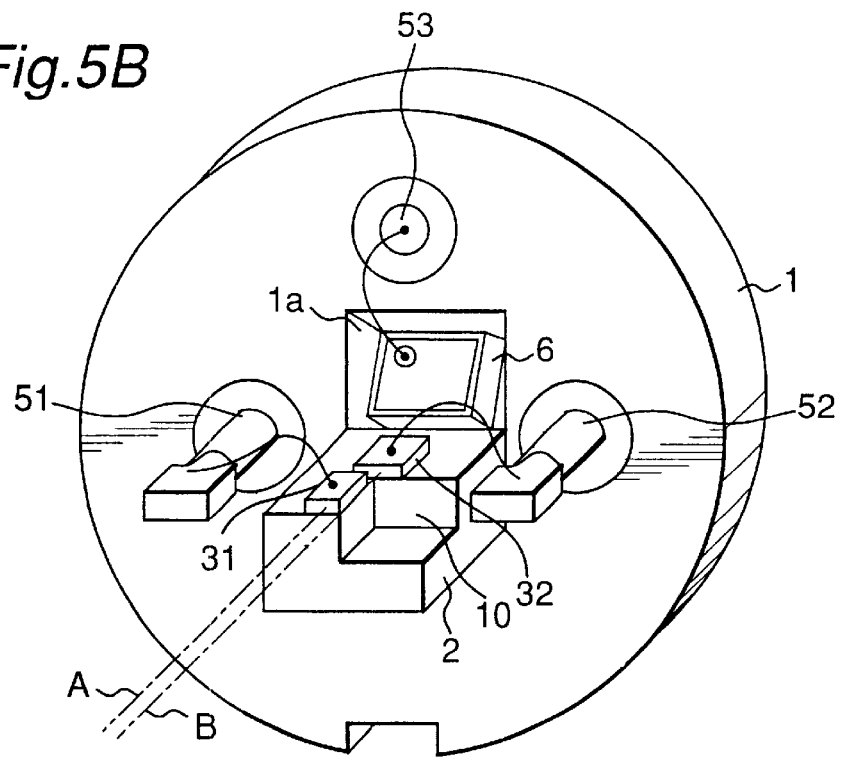
FIG. 5B is a perspective view showing the innards of a modification of the fourth embodiment, in which a cutout is provided in the heat sink block so that the light from the red semiconductor laser element is not prevented from traveling.
Figure 6:
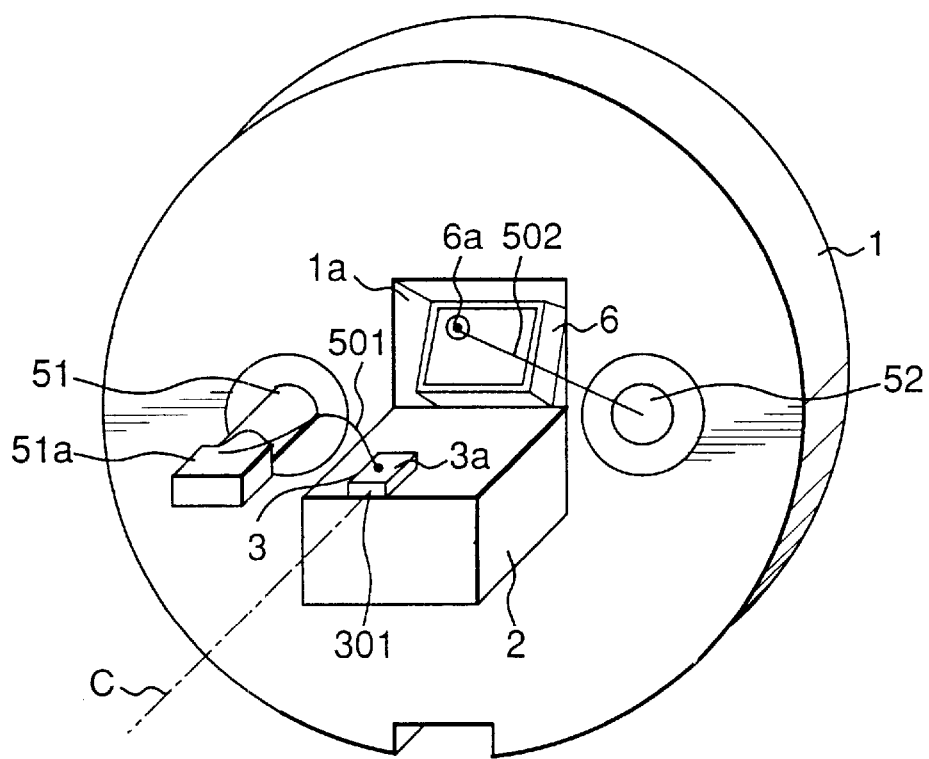
FIG. 6 is a perspective view showing the internal structure or innards of a conventional semiconductor laser device.
Figure 7:
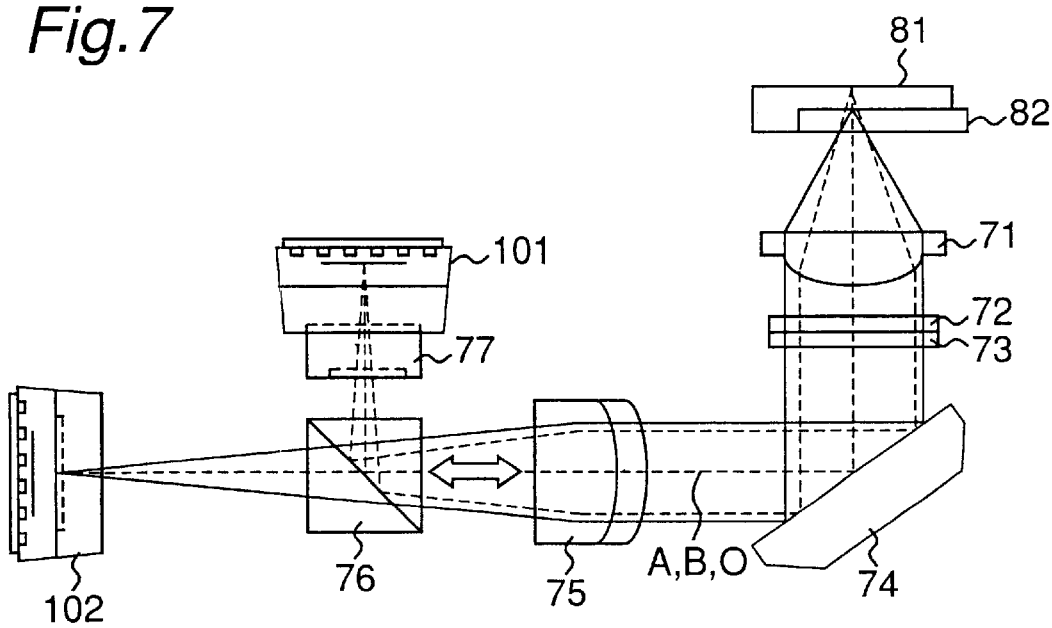
FIG. 7 schematically shows an optical pickup using a conventional semiconductor laser device and capable of reading information from and writing information to different types of optical discs.

Embodiments of the present invention will be described below in detail with reference to FIGS. 1 through 5B, in which parts same as and similar to parts shown in FIGS. 6 and 7 are denoted by same reference symbols and numerals as used in FIGS. 6 and 7.

[First Embodiment]

Figure 1:
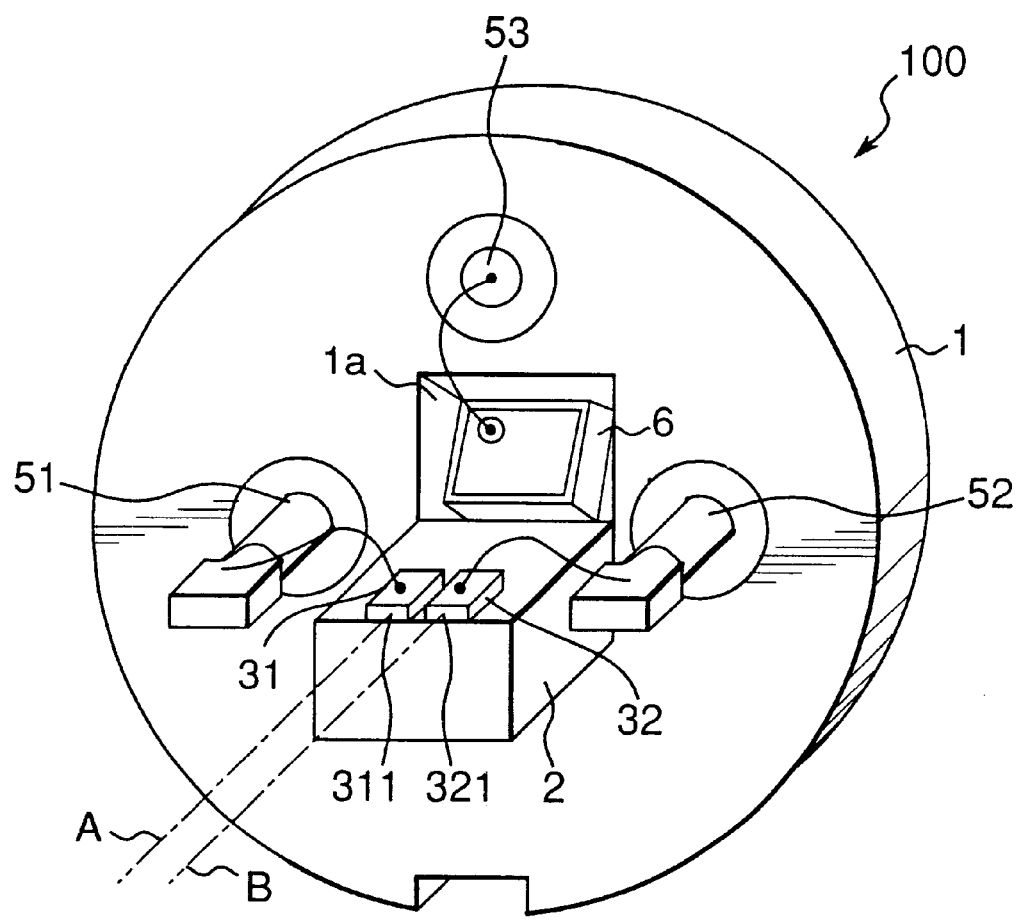
FIG. 1 is a perspective view showing the innards or inner structure of a semiconductor laser device according to a first embodiment of the present invention.

FIG. 1 shows the internal structure of a semiconductor laser device 100 according to a first embodiment of the present invention. An infrared semiconductor laser element 31 and a red semiconductor laser element 32 are mounted on a heat sink block 2 formed integrally with a mount 1.

The following describes a case that emission points of the semiconductor laser elements are aligned in the widthwise direction of the semiconductor laser elements.

Referring to FIG. 1, the distance between a semiconductor laser element-mounting surface of the heat sink block 2 and an emission point 311 of the infrared semiconductor laser element 31 is equal to the distance between the semiconductor laser element-mounting surface and an emission point 321 of the red semiconductor laser element 32. Accordingly, the emission points of the two semiconductor laser elements are aligned, or disposed parallel to each other, in the widthwise direction thereof. In an ordinary semiconductor laser element, its emission point is positioned at its center. Thus, if the width of the infrared semiconductor laser element 31 is W1 and the width of the red semiconductor laser element 32 is W2, then, the distance between the emission point 311 of the infrared semiconductor laser element 31 and the emission point 321 of the red semiconductor laser element 32, namely, the distance L between optical axes A and B is expressed by the following equation (2), using the widths W1 and W2 of the semiconductor laser elements:

$$L \geq (W1+W2)/2 \qquad (2)$$

When there is no gap between the two semiconductor laser elements, L is equal to $(W1+W2)/2$. When there is a gap between the two semiconductor laser elements, L is greater than $(W1+W2)/2$. Thus, L can also be expressed by the following equation (3).

$$L=(W1+W2)/2+G(G \geq 0) \qquad (3)$$

where G is a gap between the two semiconductor laser elements.

To avoid deterioration of the characteristic of the semiconductor laser element due to non-radiative recombination of carriers on a side surface of the laser element, it is desirable to space the emission point from the side surface of the semiconductor laser element by 5 µm or more. It is also desirable to space the two semiconductor laser elements 31 and 32 from each other by about 10 µm (G≈10 µm) to prevent them from being destroyed mechanically or becoming electrically conductive to each other. Although the widths W1 and W2 of ordinary semiconductor laser elements are 200–300 µm, semiconductor laser elements having smaller widths are used in this embodiment to set L to 160 µm or less (L≦160 µm).

Considering equations (2) and (3) as well as the spacing of 10 µm to avoid mechanical destruction, and supposing that the two semiconductor laser elements have the same width W, then (2W/2)+10≦160, from which it is obvious that semiconductor laser elements having a width W=150 µm should be used. In this embodiment, both the infrared semiconductor laser element 31 and the red semiconductor laser element 32 have the width W=150 µm to satisfy L=160 µm. Needless to say, by decreasing the width W of each semiconductor laser element, L is decreased accordingly.

Optical outputs from rear end surfaces of the infrared semiconductor laser element 31 and the red semiconductor laser element 32 are monitored by a single monitoring PD 6. The monitoring PD 6 is made of silicon (Si) and has a sensitivity to light beams of both wavelength regions. The size of a light-receiving portion is approximately 900 µm×1200 µm, which is much larger than the distance 160 µm between the emission points of the semiconductor laser elements 31 and 32. Therefore, the outputs of both semiconductor laser elements can be monitored. Further, because the two semiconductor laser elements are not used simultaneously, mixing of signals does not occur.

Similarly to the conventional semiconductor laser device, the two semiconductor laser elements 31 and 32 and the monitoring PD 6 are electrically connected to lead pins 51, 52, and 53, respectively, with gold wires so as to be connected to an external electric circuit. A cap (not shown in FIG. 1 but shown by reference numeral 110 in FIG. 2) having a laser beam-emitting window and for covering the two semiconductor laser elements 31 and 32, the heat sink block 2, and the monitoring PD 6 is welded to the mount 1 to accommodate them in one package. Although not shown, a signal-receiving photodiode PD and a signal-processing IC may be accommodated in the package. The signal-receiving photodiode PD may receive only one of an infrared laser beam and a red laser beam or both of them.

Description is made below on a case in which the distance between the semiconductor laser element-mounting surface of the heat sink block 2 and the emission point of the infrared semiconductor laser element 31 is different from the distance between the semiconductor laser element-mounting surface and the emission point of the red semiconductor laser element 32. If an angle formed between a line connecting the emission points of the two semiconductor laser elements and the width direction of the semiconductor laser elements is taken as θ, then, $$L=\{(W1+W2)/2+G\}/\cos\theta(G\geq 0) \quad (4)$$

where G is a gap between the two semiconductor laser elements, and θ is an acute angle.

For example, if the distance between the semiconductor laser element-mounting surface of the heat sink block 2 and the emission point 321 of the red is semiconductor laser element 32 is 5 μm, the distance between the semiconductor laser element-mounting surface and the emission point 311 of the infrared semiconductor laser element 31 is 50 μm, and W1=W2=150 μm, and if the two semiconductor laser elements are spaced from each other by 10 μm (G=10 μm), then, θ=15.7°. At this time, from equation (4), L is 166 μm, which value is larger by 6 μm than the case (160 μm) where the emission points of the semiconductor laser elements are aligned in the width direction of the laser elements. Further, the condition of L≦160 μm is not satisfied. Therefore, the two semiconductor laser elements are given a smaller width of 140 μm, and spaced from each other by 10 μm, to thereby achieve L=157 μm. At this time, θ=16.7°.

The above explanation has been made on the case where the front light emission end surfaces of the two semiconductor laser elements are on the same plane. In a case in which the front light emission end surfaces of the two semiconductor laser elements are dislocated from each other in the optical axis direction, an intersection between the optical axis of the first semiconductor laser element and a plane including the front light emission end surface of the second semiconductor laser element should be regarded as the emission point of the first semiconductor laser element.

Also, the above explanation has been made on the case where the width directions of the two semiconductor laser elements are parallel to each other. If, however, at least one of the semiconductor laser elements is rotated around the optical axis such that the width directions of the semiconductor laser elements are not parallel, then, it is possible to reduce L.

Figure 2:
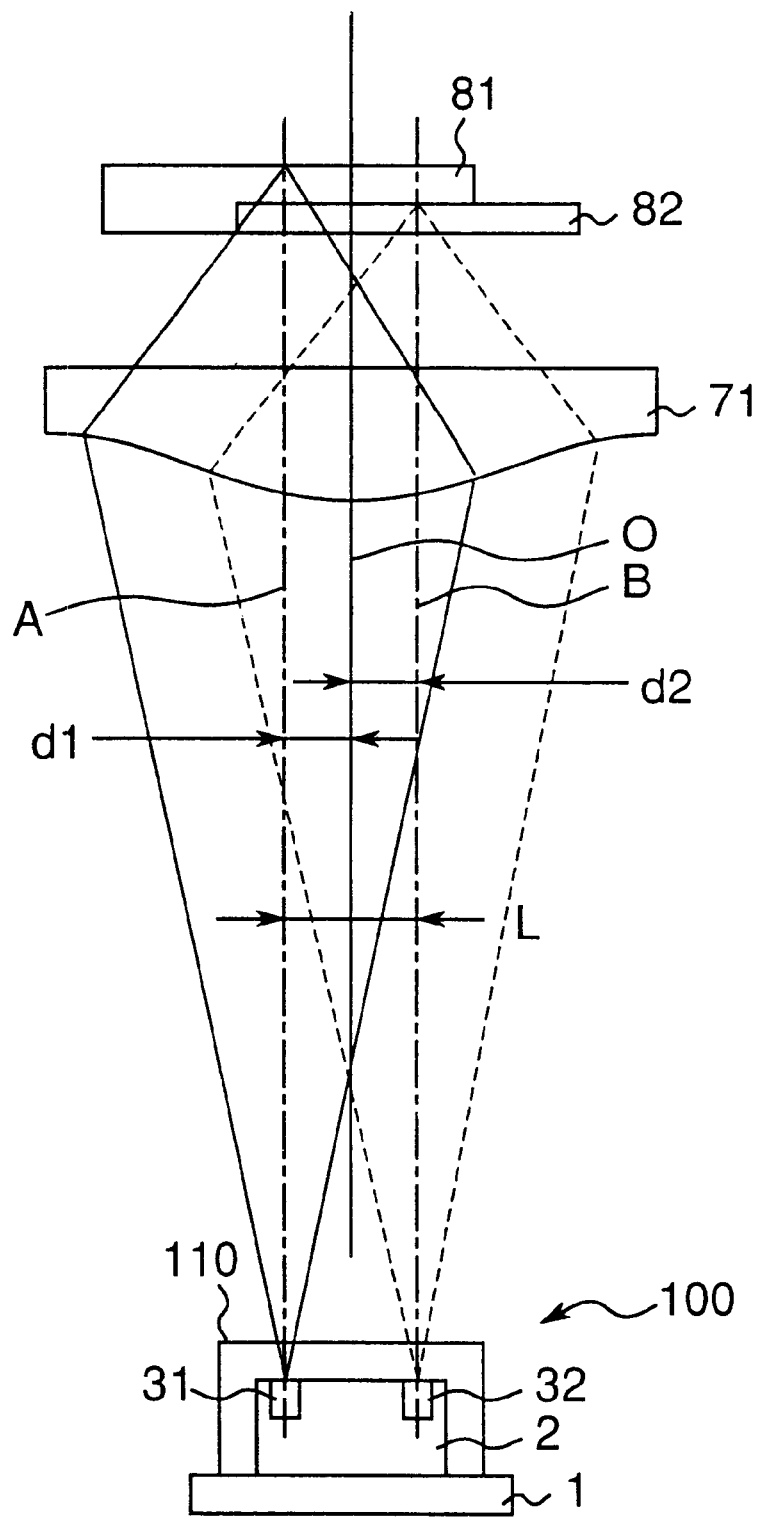
FIG. 2 schematically illustrates an optical pickup using the semiconductor laser device of the present invention and capable of reading information from and writing information to different types of optical discs.

FIG. 2 shows an optical pickup constructed by using the semiconductor laser device 100 of the present invention, the optical pickup being capable of reading information from and writing information to different types of optical discs. In FIG. 2, the interval between semiconductor laser elements is exaggerated. Referring to FIG. 2, the center axis O of a condenser lens 71, the optical axis A of the infrared semiconductor laser element 31, and the optical axis B of the red semiconductor laser element 32 have been adjusted such that they are parallel to each other. Adjustment has been made such that the distance between the two optical axes A and B is L and that the axis O of the condenser lens 71 falls on the line connecting the emission points of the two semiconductor laser elements. As a result, the distance d1 between the optical axis A and the center axis O and the distance d2 between the optical axis B and the center axis O are each 80 μm or less. Thus, as is obvious from FIG. 2, d1+d2=L≦160 μm. Accordingly, it is possible to realize an optical pickup capable of reading information from and writing information to different types of optical discs, without using the prism 76, which is essential to the conventional optical pickup shown in FIG. 7, nor without moving the condenser lens 71. So long as neither distance d1 nor the distance d2 exceeds 80 μm, the center axis O of the condenser lens 71 may be located outside the line connecting the two semiconductor laser elements. In this case, d1+d2 is greater than L (d1+d2>L). Thus, the value of L is required to be smaller than the case where the center axis O of the condenser lens 71 falls on the line connecting the two semiconductor laser elements.

Although not shown in FIG. 2 for the sake of simplicity, the semiconductor laser device 100 may be provided with a hologram for generating three light beams and changing the direction in which a signal beam travels. Needless to say, it is also possible to provide either an optical element for enlarging the diameter of a red laser beam or an aperture for limiting the diameter of the red laser beam between the condenser lens 71 and the semiconductor laser device 100 to control the numerical aperture NA.

[Second Embodiment]

Figure 3A:
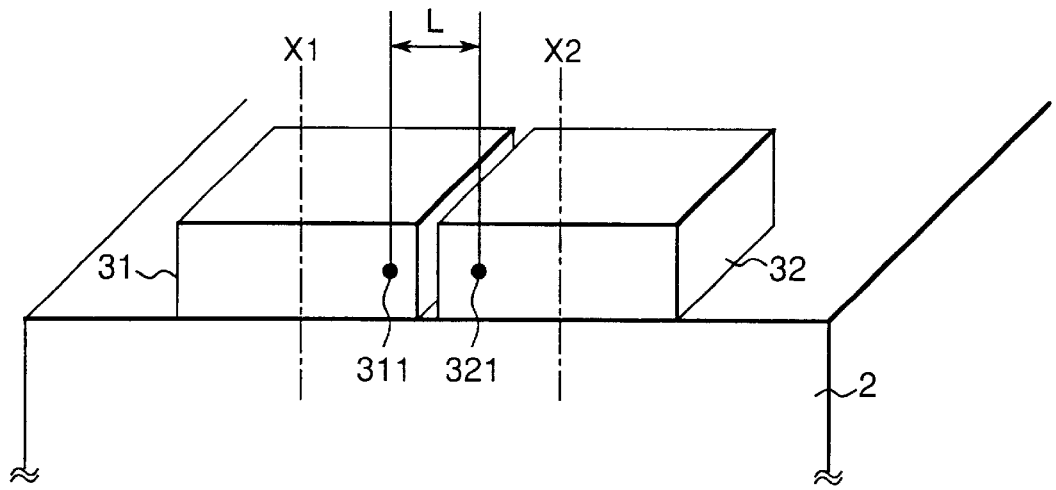
FIG. 3A is an enlarged perspective view showing semiconductor laser elements and a heat sink block on which the semiconductor laser elements is mounted, which are part of the innards of a semiconductor laser device of a second embodiment of the present invention.

FIG. 3A is a perspective view showing only semiconductor laser elements and a heat sink block for mounting the semiconductor laser elements in a semiconductor laser device according to a second embodiment of the present invention.

Figure 3B:
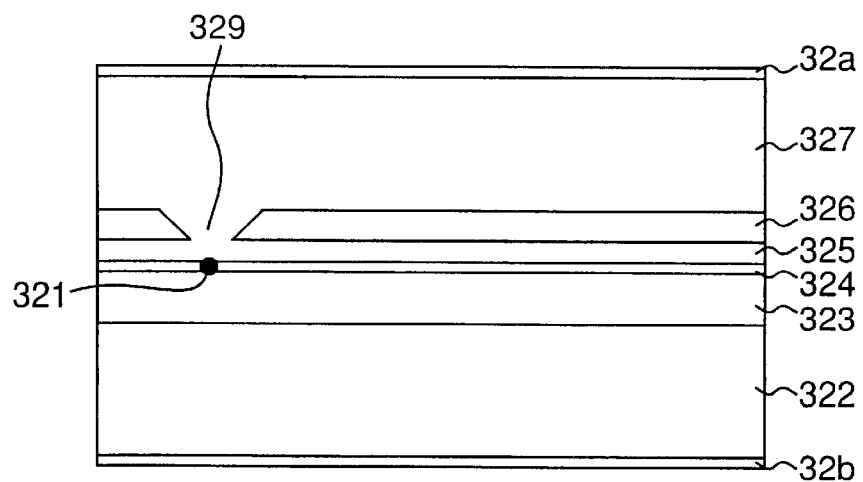
FIG. 3B shows an enlarged end face of a semiconductor laser element to be used in the second embodiment, which has an emission point not positioned at its center.

In this embodiment, the width of each of the semiconductor laser elements 31 and 32 is 300 μm, which is similar to that of the ordinary semiconductor laser elements, but the emission points of the semiconductor laser elements 31 and 32 are not located at the center thereof. FIG. 3B enlargingly shows a front emission end surface of the semiconductor laser element 32 of the second embodiment whose emission point is not positioned at the center thereof. The semiconductor laser element has a construction in which the light emission end surface structure is extended perpendicularly to the drawing sheet. The schematic layered construction of the light emission end surface is as follows: a lower electrode 32b, a semiconductor substrate 322, a lower cladding layer 323, an active layer 324, a first upper cladding layer 325, a current-constricting layer 326, a second upper cladding layer 325, and an upper electrode 32a. When a forward voltage is applied between the upper electrode 32a and the lower electrode 32b, electric current flows through an opening portion 329 of the current-constricting layer 326. Current density is high in the neighborhood of the opening portion 329. Thus, carrier density is high there. Thus, laser oscillation takes place. As a result, the emission point 321 is provided by a portion of the active layer 324 that is located immediately below the opening portion 329 of the electric current current-constricting layer. Actually, the portion constituting the emission point 321 has a size of several micrometers, but can be regarded as a point in forming the optical pickup. The position of the emission point 321 can be determined according to the position of the opening portion 329. As can be easily understood from FIG. 3A, an end surface of the semiconductor laser element 31 is substantially a mirror image of the end surface of the semiconductor laser element 32.

As shown in FIG. 3A, the semiconductor laser elements 31 and 32 are placed on the heat sink block 2 such that their respective emission points 311 and 321 are disposed between center axes X1 and X2 of the semiconductor laser elements 31 and 32. It is necessary that the distance between the emission point and the side surface should be 5 μm or more, as described above. It is also necessary that the spacing between the two semiconductor laser elements should be 10 μm or more. From this, it is necessary that the distance between the emission points 311 and 321 of the semiconductor laser elements, namely, the distance L between the optical axes A and B should be 5×2+10=20 μm. It is possible to make L much smaller than the target L≦160 μm. That is, it is possible to reduce L by about 140 μm, compared with the first embodiment.

[Third Embodiment]

Figure 4A:
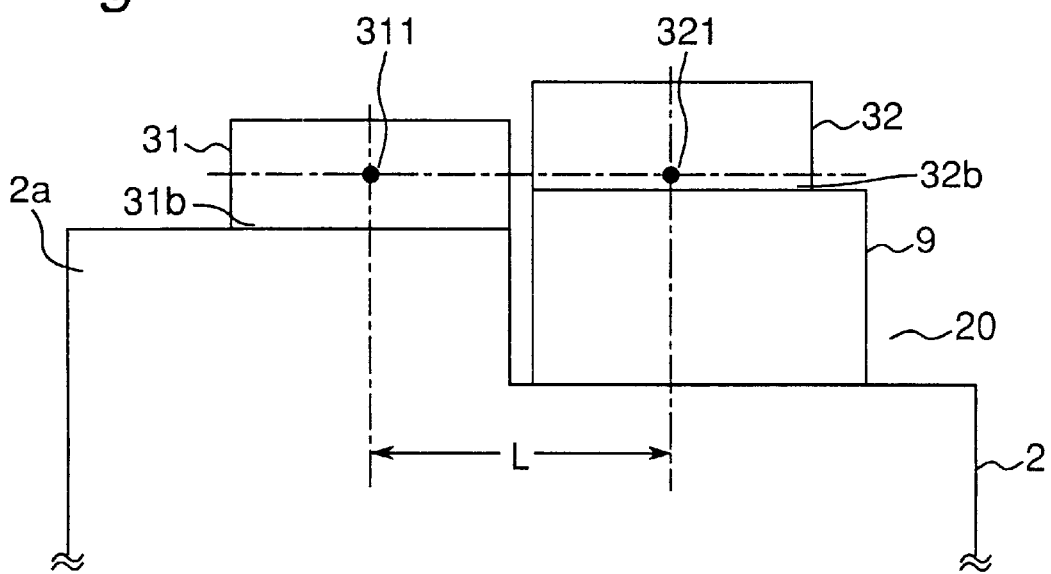
FIG. 4A is an enlarged front view showing semiconductor laser elements and a heat sink block on which the semiconductor laser elements is mounted, which are part of the innards of a semiconductor laser device of a third embodiment of the present invention, wherein only a red semiconductor laser element is shown mounted on a sub-mount.

FIG. 4A is a perspective view showing only semiconductor laser elements and a heat sink block for mounting the semiconductor laser elements in a semiconductor laser device according to a third embodiment of the present invention.

The emission point 321 of the red semiconductor laser element 32 is located at about 5 μm from a surface of the lower electrode 32b. On the other hand, the emission point 311 of the infrared semiconductor laser element 31 is located at about 50 μm from a surface of a lower electrode 31b thereof. As shown in FIG. 4A, after the red semiconductor laser element 32 is mounted on a sub-mount 9, they are mounted on the heat sink block 2. A part of the heat sink block 2 is cut out. The red semiconductor laser element 32 mounted on the sub-mount 9 is installed in a cutout portion 20. Thereby, the vertical positions of the emission points 311 and 321 of the two semiconductor laser elements 31 and 32 are at the same level. As the material of the sub-mount 9, aluminum nitride (AlN) having a favorable heat discharge characteristic is used.

As the material of the sub-mount 9, alternatively to aluminum nitride, ceramic such as silicon carbide (SiC), diamond, or beryllia (BeO), or silicon can be used. In particular, by using semiconductor such as silicon, it is possible to form the monitoring PD on the sub-mount 9, which allows the semiconductor laser device to be compact and reduces the production time.

If there is provided a gap of 10 μm between a confronting side surface of a step 2a of the heat sink block 2 and a confronting side surface of the sub-mount 9 and if the semiconductor laser elements are mounted such that a side surface of the semiconductor laser element 31 is flush with the confronting side surface of the step 2a and that a side surface of the semiconductor laser element 32 is flush with the confronting side surface of the sub-mount 9, then, it is possible to set the distance between the emission points of the semiconductor laser elements 31 and 32, namely, the distance L between the optical axes of the laser beams to L=160 μm, by using the semiconductor laser elements having a width of 150 μm as in the first embodiment. Further, if semiconductor laser elements whose emission points are not located at the center as in the second embodiment are used as the semiconductor laser elements 31 and 32, then, it is possible to set L to any desired value satisfying L≧20 μm.

Figure 4B:
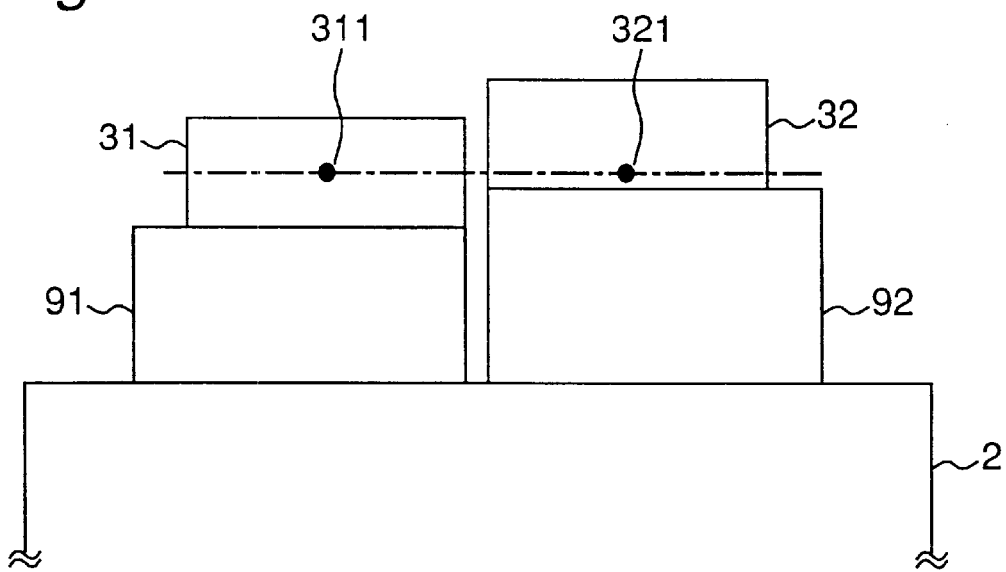
FIG. 4B shows a modification of the embodiment shown in FIG. 4A, in which both the infrared semiconductor laser element and the red semiconductor laser element are shown mounted on sub-mounts.

Further, as shown in FIG. 4B, both the infrared semiconductor laser element 31 and the red semiconductor laser element 32 may be mounted on sub-mounts 91 and 92, respectively.

[Fourth Embodiment]

FIG. 5A shows the internal structure, or innards, of a semiconductor laser device according to a fourth embodiment of the present invention.

In the semiconductor laser device of the fourth embodiment, the red semiconductor laser element 32 is shifted in the optical axis direction, on the heat sink block 2, to rearward (toward the mount 1) of the infrared semiconductor laser element 31, and also shifted in a direction perpendicular to its optical axis toward the infrared semiconductor laser element 31 to such a degree that the optical axis B of the red semiconductor laser element 32 does not fall on the infrared semiconductor laser element 31. Conversely to the construction shown in FIG. 5A, the infrared semiconductor laser element 31 may be shifted such that the infrared semiconductor laser element 31 is rearward of the red semiconductor laser element 32 and overlaps the red semiconductor laser element 32 in the width direction thereof. For the semiconductor laser elements 31 and 32 of the fourth embodiment, ordinary semiconductor laser elements are used which are 200 μm in width and in which an emission point is at the center.

It is possible to set the distance L between the optical axis A of the infrared semiconductor laser element 31 and the optical axis B of the red semiconductor laser element 32 to half the width of the infrared semiconductor laser element 31, namely, about 100 μm.

In the fourth embodiment, similarly to the third embodiment or its modification, one of the two semiconductor laser elements or both semiconductor laser elements may be mounted on a sub-mount or sub-mounts. Further, if at least the semiconductor laser element positioned forward in the laser emission direction (the infrared semiconductor laser element 31 in the case of FIG. 5A) is provided by a semiconductor laser element whose emission point is not positioned at its center as shown in FIG. 3A and if the optical axis of the rear semiconductor laser element (the red semiconductor laser element 32 in the case of FIG. 5A) runs immediately outside a side surface of the forward semiconductor laser element, then, it is possible to further reduce the distance between the optical axes of the semiconductor laser elements. By using a semiconductor laser element whose emission point is positioned at 5 μm from a side surface thereof, it is possible to set L to L≈5 μm.

Emitted light of the ordinary semiconductor laser element radiates elliptically. In particular, it is known that the emitted light spreads greatly in a direction perpendicular to the active layer (see 324 of FIG. 3B). Therefore, if the semiconductor laser element is mounted on the heat sink block 2 such that its emission point is located at a position other than an end portion of the heat sink block 2, a part of the emitted light may be reflected by the heat sink block 2 so that the direction in which the light travels is changed. In this case, the quantity of light that is incident on the condenser lens will become much smaller than output of the semiconductor laser element. To prevent such a loss of the emitted light, in the arrangement shown in FIG. 5B, the heat sink block 2 is provided with a cutout portion 10 which extends forward of the red semiconductor laser element 32 in the optical axis direction so that the emitted light of the red semiconductor laser element 32 is not prevented from travelling.

In the second through fourth embodiments, description has been made on only the case where the emission points of two semiconductor laser elements are at the same distance from the semiconductor laser element-mounting surface of the heat sink block. But they may be at different distances, as described above in connection with the first embodiment.

In particular, in the case of the third embodiment, advantageously, use of the sub-mount not only allows a value of L to be reduced to a possible shortest distance by equalizing the distances from the semiconductor laser element-mounting surface of the heat sink block to each of the emission points of semiconductor laser elements, but also allows the semiconductor laser element to be inspected before it is assembled in the semiconductor laser device. Further, in the case where the semiconductor laser element is fixed to the heat sink block with a soldering material, it is necessary to use a large amount of a soft soldering material considering the compatibility with the material of the heat sink block. Thus, the soldering material overflows between the semiconductor laser element and the heat sink block. If the distance between the heat sink block and the emission point is short at this time, there may occur a problem that the soldering material rises up to the emission point and blocks the travel path of the laser beam partly or climbs the semiconductor laser element and causes a short circuit. Such a problem can be solved by mounting the semiconductor laser element on the heat sink block through the sub-mount as described in connection with the third embodiment. The semiconductor laser element is also fixed to the sub-mount with a soldering material. In this case, however, a soldering material having a linear expansion coefficient close to that of the semiconductor laser element, namely, a comparatively hard soldering material can be used owing to the material of the sub-mount. Therefore, the soldering material is used in a small amount. Accordingly, in this case, the soldering material is free from the problem of the overflow.

Further, in the fourth embodiment, if the semiconductor laser element located at the rear side (on the side of the mount) is mounted on the heat sink block through a sub-mount, then, the emission point of this semiconductor laser element is located sufficiently away from the semiconductor laser element-mounting surface of the heat sink block. Thus, the heat sink block does not block the travel of the laser beam. Accordingly, in this case, it is unnecessary to provide the heat sink block with the cutout portion shown in FIG. 5B.

The above description has been made on the case where the red semiconductor laser element and the infrared semiconductor laser element are used. However, it is possible to use other semiconductor laser elements, for example, GaN semiconductor laser elements. The GaN semiconductor laser elements provide a laser beam having a wavelength of ultraviolet, blue, or green. If a blue semiconductor laser element is required for optical discs, then, needless to say, the semiconductor laser device of the present invention may be constructed by, for example, combination of the blue semiconductor laser element and the red semiconductor laser element or combination of the infrared semiconductor laser element and the blue semiconductor laser element.

Further, a semiconductor laser device using three semiconductor laser elements can be manufactured in a similar way. That is, if the distance between a third semiconductor laser element and the axis of the condenser lens is taken as d3, then a value of d1+d3, a value of d2+d3, and a value of d1+d2 should be 160 $\mu$m or less. Also, if the distance between the optical axes of the first and third semiconductor laser elements and the distance between the optical axes of the second and third semiconductor laser elements are taken as L1 and L2, respectively, then, needless to say, L1 and L2 should not be larger than d1+d3 and d2+d3, respectively. The semiconductor laser device using the three semiconductor laser elements can adopt a construction as disclosed in FIG. 5 of JP-A-10-335746 by this Applicant. In the semiconductor laser device disclosed in FIG. 5 of JP-A-10-335746, three semiconductor laser elements are mounted on separate heat sink mounts and then placed in position. In contrast, according to the present invention, the three semiconductor laser elements are mounted on one common heat sink block. The construction of the present invention is superior to the above prior art reference in the accuracy of the relative position between two semiconductor laser elements.

What is claimed is:

1. A semiconductor laser device for use in an optical pickup reading and writing information by selecting one of light beams emitted by two semiconductor laser elements having different emission wavelengths and then condensing the selected light beam on one of different optical discs through an optical system including a condenser lens, comprising:

a heat sink block; and a first semiconductor laser element and a second semiconductor laser element having different emission wavelengths and mounted on the beat sink block such that optical axes of the first and second semiconductor laser elements are substantially parallel to each other, wherein the first and second semiconductor laser elements are mounted on the heat sink block in such a manner that the following relationship is satisfied:

$0<d1\leq 80\ \mu m,$ and $0<d2\leq 80\ \mu m,$ where d1 is a distance between the optical axis of the first semiconductor laser element and a center axis of the condenser lens, and d2 is a distance between the optical axis of the second semiconductor laser element and the center axis of the condenser lens.

2. The semiconductor laser device according to claim 1, wherein the distance of an emission point of the first semiconductor laser element from a lower surface or a lower electrode thereof is different from the distance of an emission point of the second semiconductor laser clement from a lower surface of a lower electrode thereof.

3. The semiconductor laser device according to claim 1, wherein the first and second semiconductor laser elements are spaced 10 $\mu$m or more from each other.

4. The semiconductor laser device according to claim 1, wherein one of the first and second semiconductor laser elements is shifted in the direction of its optical axis to rearward of the other semiconductor laser element such that the emission end surfaces of the first and second semiconductor laser elements are contained in different planes, and the one semiconductor laser element that is shifted to rearward is in addition shifted in a direction perpendicular to its optical axis toward the other semiconductor laser element to an extent that the optical axis of the one semiconductor laser element does not pass the other semiconductor laser element.

5. The semiconductor laser device according to claim 4, wherein the heat sink block has a cutout that is located forward in a direction in which light emitted by the one semiconductor laser element travels.

6. The semiconductor laser device according to claim 1, wherein the first and second semiconductor laser elements and the heat sink block are accommodated in a same package.

7. The semiconductor laser device according to claim 1, wherein at least one of the first and second semiconductor laser elements is mounted on a sub-mount.

8. The semiconductor laser device according to claim 1, wherein emission points of the first and the second semiconductor laser elements are located between a center axis of the first semiconductor laser element and a center axis of the second semiconductor laser element.

9. The semiconductor laser device according to claim 1, further comprising a third semiconductor laser element having an emission wavelength different from the wavelengths of the first and second semiconductor laser elements and mounted on the heat sink block such that an optical axis of the third semiconductor laser element is substantially parallel to each of the optical axes of the first and second semiconductor laser elements, wherein the three semiconductor laser elements are mounted on the heat sink block in such a manner that the following relationships are satisfied:

$$0 < L1 \leq d1 + d3 \leq 160 \, \mu m,$$

and $$0 < L2 \leq d2 + d3 \leq 160 \, \mu m,$$

where $d3$ is a distance between the optical axis of the third semiconductor laser element and the axis of the condenser lens, $L1$ is a distance between the optical axes of the first and third semiconductor laser elements, and $L2$ is a distance between the optical axes of the second and third semiconductor laser elements.

10. The semiconductor laser device according to claim 9, wherein $0 < d3 \leq 80 \, \mu m$.

* * * * *